(12) United States Patent
Ting et al.

(10) Patent No.: US 10,177,272 B2
(45) Date of Patent: *Jan. 8, 2019

(54) LIGHT-EMITTING DIODE AND A METHOD FOR MANUFACTURING THE SAME

(71) Applicant: Genesis Photonics Inc., Tainan (TW)

(72) Inventors: Shao-Ying Ting, Tainan (TW); Jing-En Huang, Tainan (TW)

(73) Assignee: GENESIS PHOTONICS INC., Tainan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/670,050

(22) Filed: Aug. 7, 2017

(65) Prior Publication Data

US 2017/0338375 A1 Nov. 23, 2017

Related U.S. Application Data

(63) Continuation of application No. 15/045,440, filed on Feb. 17, 2016, now Pat. No. 9,728,672.

(30) Foreign Application Priority Data

Jul. 23, 2015 (TW) .............................. 104123854 A

(51) Int. Cl.
*H01L 21/683* (2006.01)
*H01L 23/00* (2006.01)
(Continued)

(52) U.S. Cl.
CPC ...... *H01L 33/0079* (2013.01); *H01L 21/6835* (2013.01); *H01L 21/6836* (2013.01);
(Continued)

(58) Field of Classification Search
CPC .......... H01L 33/60; H01L 2221/68336; H01L 33/0095; H01L 2221/68327;
(Continued)

(56) References Cited

U.S. PATENT DOCUMENTS 6,462,358 B1 10/2002 Lin et al.
9,728,672 B2 * 8/2017 Ting .................... H01L 33/0095
(Continued)

FOREIGN PATENT DOCUMENTS

CN 102543708 A 7/2012
CN 202572118 U 12/2012
(Continued)

OTHER PUBLICATIONS

TIPO Office Action dated Jun. 7, 2016 in Taiwan application (No. 104123854).
CN Office Action dated Aug. 24, 2018 in Chinese application (No. 201610088972.X).

*Primary Examiner* — Changhyun Yi
(74) *Attorney, Agent, or Firm* — McClure, Qualey & Rodack, LLP

(57) ABSTRACT

A method for manufacturing a light-emitting diode (LED) is provided. The method includes following steps. A LED wafer including a substrate and a plurality of light-emitting units formed thereon is provided. At least a portion of the substrate is removed. The LED wafer is fixed on an extensible membrane, wherein the light-emitting unit faces the extensible membrane. The LED wafer is broken to form a plurality of LED dices separated from each other, wherein each LED dice includes at least one light-emitting unit. The extensible membrane is expanded to make a distance between any two of the LED dices become larger.

20 Claims, 6 Drawing Sheets

(51) Int. Cl.
*H01L 33/00* (2010.01)
*H01L 33/06* (2010.01)
*H01L 33/32* (2010.01)

(52) U.S. Cl.
CPC ...... *H01L 33/0075* (2013.01); *H01L 33/0095* (2013.01); *H01L 33/06* (2013.01); *H01L 33/32* (2013.01); *H01L 2221/6834* (2013.01); *H01L 2221/68327* (2013.01); *H01L 2221/68336* (2013.01); *H01L 2221/68381* (2013.01)

(58) Field of Classification Search
CPC .......... H01L 33/0079; H01L 25/075–25/0756; H01L 21/78–21/86
See application file for complete search history.

(56) References Cited

U.S. PATENT DOCUMENTS

| | | | |
|---|---|---|---|
| 2005/0221598 A1 | 10/2005 | Lu et al. | |
| 2005/0233483 A1 | 10/2005 | Asakawa et al. | |
| 2014/0004636 A1* | 1/2014 | Takahashi | H01L 33/60 438/29 |

FOREIGN PATENT DOCUMENTS

| | | |
|---|---|---|
| CN | 103240806 A | 8/2013 |
| CN | 103531673 A | 1/2014 |
| TW | 518771 B | 1/2003 |
| TW | 200520249 | 6/2005 |
| TW | 201222864 A1 | 6/2012 |
| TW | M434309 U1 | 7/2012 |

\* cited by examiner

LIGHT-EMITTING DIODE AND A METHOD FOR MANUFACTURING THE SAME

This application is a continuation application of application Ser. No. 15/045,440, filed on Feb. 17, 2016, now U.S. Pat. No. 9,728,672, which claims the benefit of U.S. provisional application No. 62/116,923, filed on Feb. 17, 2015, and the benefit of Taiwan application No. 104123854, filed on Jul. 23, 2015, the contents of which are incorporated herein by reference.

TECHNICAL FIELD

The disclosure relates in general to a light-emitting diode (LED) and a method for manufacturing the same, and more particularly to an LED manufactured by grinding, cutting, and breaking an LED wafer and a manufacturing method thereof.

BACKGROUND

According to the generally-known method of manufacturing an LED, firstly, a light-emitting element is formed on the epitaxy of a substrate, wherein the light-emitting element comprises an n-type semiconductor layer, a light-emitting layer and a p-type semiconductor layer. The substrate and the light-emitting element together form an LED wafer. Then, one surface of the LED wafer having the light-emitting element is fixed on a crafting table using a liquid wax having adhesion. Then, the other surface of the substrate opposite to the light-emitting element is grinded until the substrate reaches a predetermined smaller thickness. Then, the LED wafer is removed from the crafting table, and the LED wafer is further cut and separated to obtain a plurality of LEDs.

After the LED wafer is removed from the crafting table, the LED wafer may easily become warped due to residual stress. Furthermore, since the substrate becomes thinner after grinding, the warping effect caused by residual stress becomes more apparent. Additionally, the substrate being too thin may easily end up with breakage or damage. Particularly, during the cutting process, the wafer may be easily broken or damaged. Therefore, the generally known manufacturing method of LED still needs to be improved.

SUMMARY

The disclosure is directed to a light-emitting diode (LED) and a manufacturing method thereof capable of increasing product quality and avoiding wafer warpage and substrate breakage.

A method for manufacturing a light-emitting diode (LED) in the present disclosure includes following steps. A LED wafer including a substrate and a plurality of light-emitting units formed thereon is provided. At least a portion of the substrate is removed. The LED wafer is fixed on an extensible membrane, wherein the light-emitting unit faces the extensible membrane. The LED wafer is broken to form a plurality of LED dices separated from each other, wherein each LED dice includes at least one light-emitting unit. The extensible membrane is expanded to make a distance between any two of the LED dices become larger.

A method for manufacturing a light-emitting diode (LED) in the present disclosure includes following steps. A LED wafer including a substrate and a plurality of light-emitting units formed on the substrate is provided. At least a portion of the substrate is removed. A fixing piece is pasted on a surface of the LED wafer. The LED wafer is fixed to an extensible membrane, wherein the light-emitting unit faces the extensible membrane, and the LED wafer is disposed between the fixing piece and the extensible membrane, and the fixing piece, the LED wafer and the extensible membrane form a complex. The LED wafer is broken in the complex to form a plurality of LED dices. The fixing piece is removed from the complex to remain the LED dices disposed on the extensible membrane. The extensible membrane is expanded to make a distance between any two of the LED dices become larger.

The advantage of the disclosure is that before the LED wafer is removed from the crafting table, the fixing piece is firstly pasted on the LED wafer to provide a supporting force to the LED wafer to maintain the flatness of the wafer and avoid the wafer being warped due to residual stress. Furthermore, the fixing piece helps to enhance the structural strength of LED wafer and avoid the substrate being broken or damaged, such that the quality and reliability of the manufactured products can be increased. Additionally, through the design of suitable thickness ratio between the elements (such as 2-20 times exemplified above) or suitable beam-divergence angle, the LED can achieve better centralization effect of the light, and is advantageous to the situation requiring the light to be centralized.

The above and other aspects of the disclosure will become better understood with regard to the following detailed description of the preferred but non-limiting embodiment (s). The following description is made with reference to the accompanying drawings.

Figure 1:
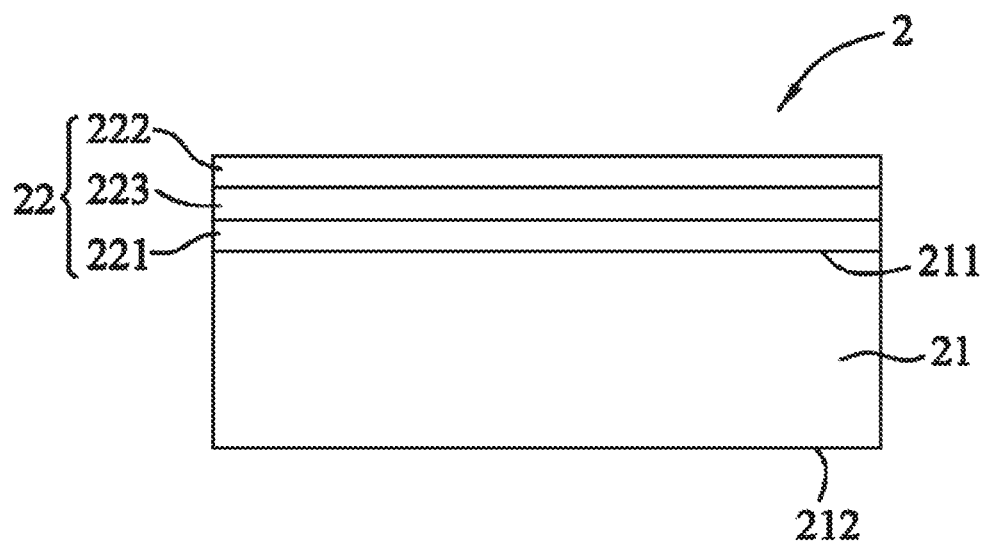
FIG. 1 is a schematic diagram of an LED wafer.
Figure 2:
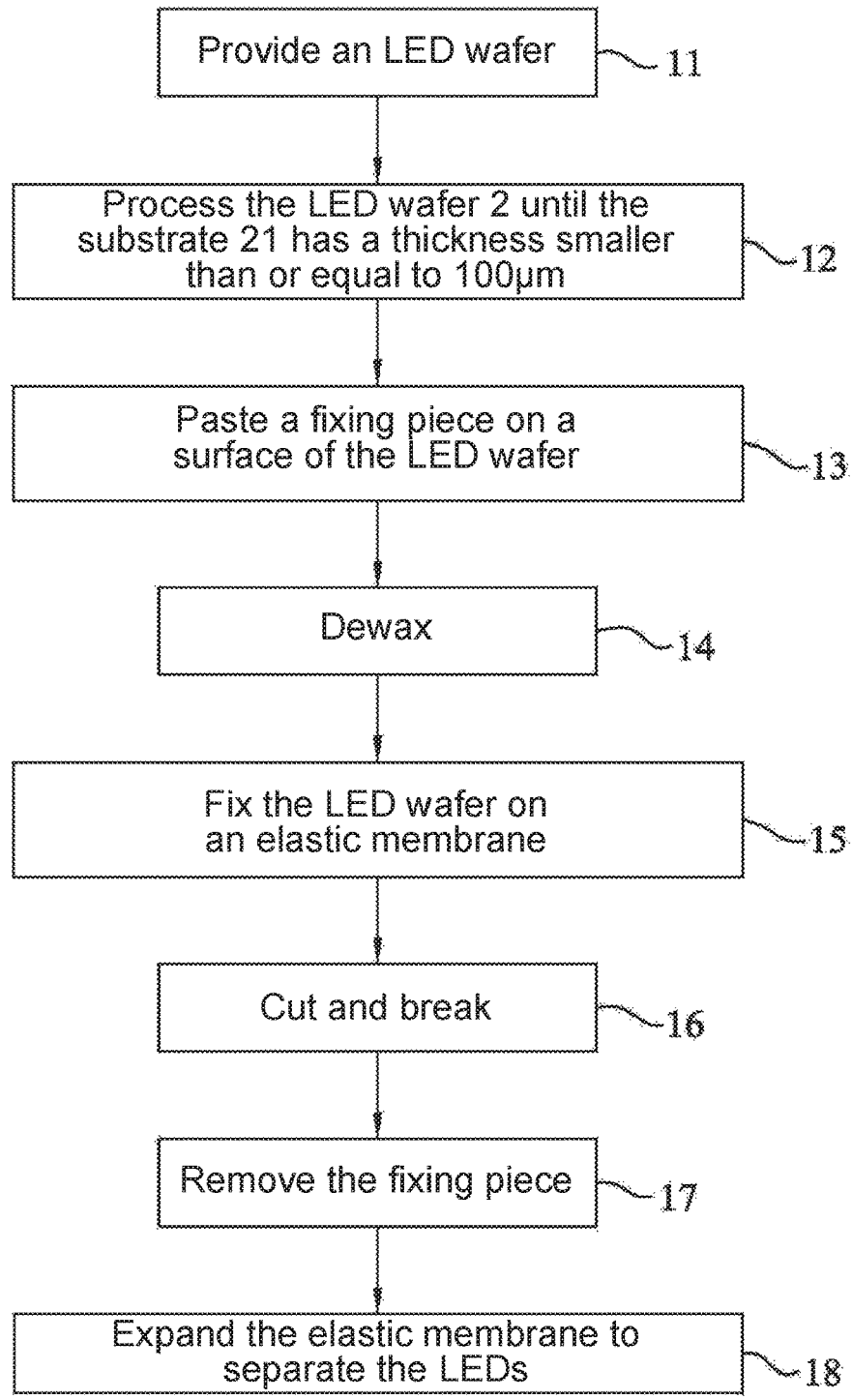
FIG. 2 is a flow diagram of a manufacturing method of LED according to an embodiment of the disclosure.
Figure 3:
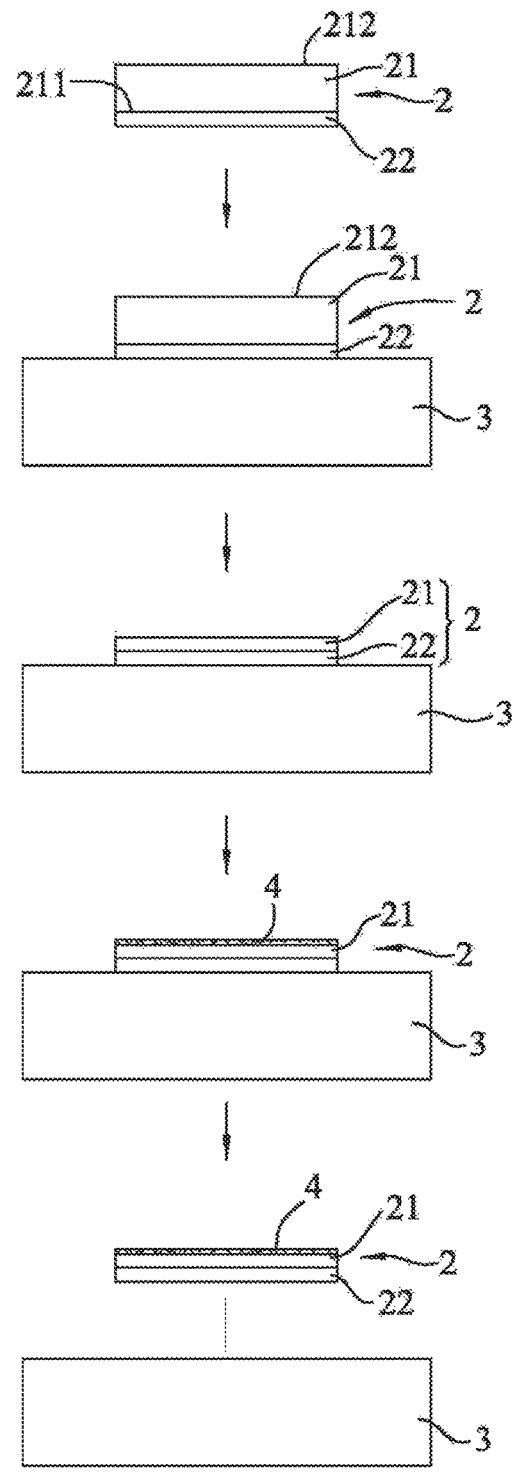
FIG. 3 is a schematic diagram of partial steps of the manufacturing method according to an embodiment of the disclosure.
Figure 4:
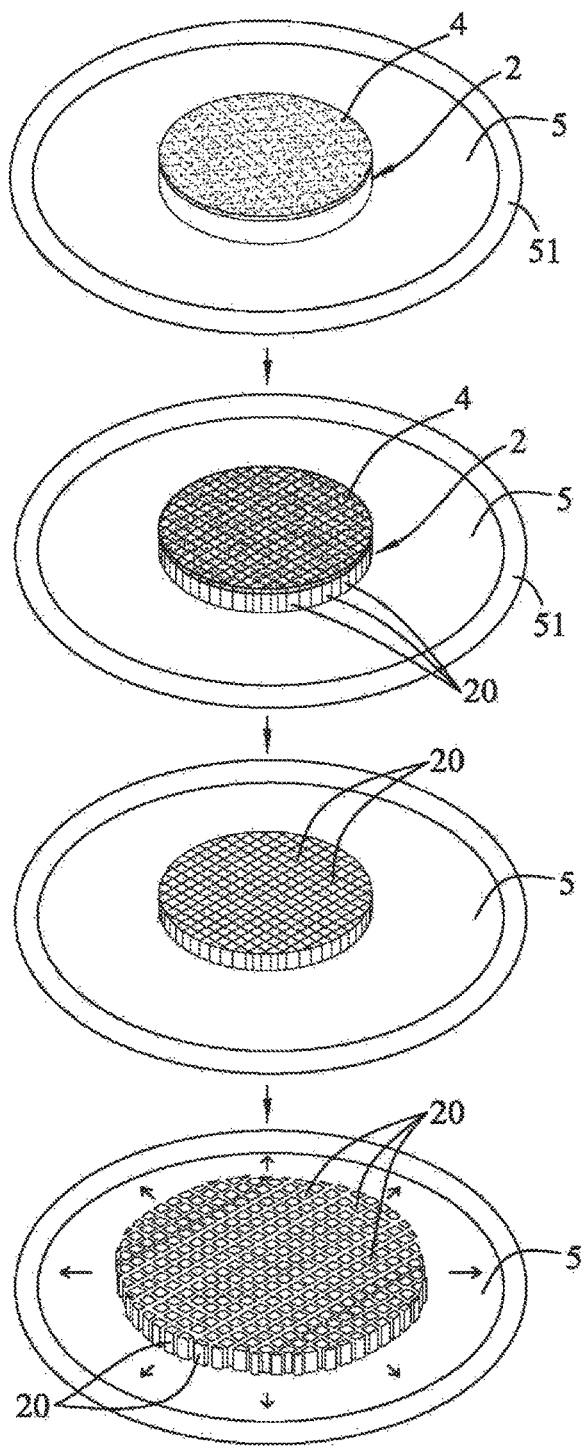
FIG. 4 is a schematic diagram of remaining steps of the manufacturing method according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Referring to FIGS. 1-4, the manufacturing method of LED according to an embodiment of the disclosure includes following steps:

Step 11: an LED wafer 2 is provided, wherein the LED wafer 2 includes a substrate 21, and a light-emitting unit 22 covering the substrate 21. The substrate 21 can be a sapphire substrate, a gallium nitride (GaN) substrate, an aluminum nitride (AlN) substrate, a silicon substrate, or a silicon carbide (SIC) substrate. The substrate 21 is not limited to any specific type of substrate but is exemplified by a sapphire substrate in the present embodiment. The substrate 21 has a thickness around 430 μm, and has a first side 211 and a second side 212 opposite to the first side 211.

The light-emitting unit 22, disposed on the first side 211 of the substrate 21, has an n-type semiconductor layer 221 disposed on the first side 211, a p-type semiconductor layer 222 disposed above the n-type semiconductor layer 221 at an interval, and a light-emitting layer 223 interposed between the n-type semiconductor layer 221 and the p-type semiconductor layer 222. Let the GaN LED be taken for example. The n-type semiconductor layer 221 and the p-type semiconductor layer 222 can be formed of an n-type GaN material and a p-type GaN material, respectively. The light-emitting layer 223, also referred as the active layer, can be formed of a multiple quantum well (MQW) structure. The light-emitting layer 223 can be formed of a material such as GaN, indium gallium nitride (InGaN), or aluminum gallium nitride (AlGaN). However, in the implementation of the present embodiment, the material of each layer of the light-emitting unit 22 is not limited to any specific restrictions. Besides, the LED wafer 2 further includes an electrode not illustrated in the diagram but connected to the light-emitting unit 22 to transmit an external power to the light-emitting unit 22, which converts an electric energy into an optical energy. Since the electrode is not the focus of improvement in the disclosure, detailed descriptions of the electrode are not disclosed here.

Step 12: the LED wafer 2 is processed by way of grinding until the substrate 21 has a thickness smaller than or equal to 100 μm. Preferably, the thickness is smaller than or equal to 50 μm. To be more specific, in the present step, the first side 211 of the substrate 21 faces downward and the second side 212 faces upwards, and a liquid wax having adhesion is coated on a surface of the light-emitting unit 22 for fixing the LED wafer 2 on a crafting table 3. The present step is also referred as the waxing step. Then, the second side 212 of the substrate 21 can be grinded by a grinder and then polished by a polisher until the substrate 21 has a thickness smaller than or equal to 100 μm.

Step 13: a fixing piece 4 is pasted on a surface of the LED wafer 2. The fixing piece 4 of the present embodiment is a sheet whose surface has viscose and adhesion. The fixing piece 4 is adhered on the surface of the substrate 21 facing upwards.

Step 14: the LED wafer 2 is washed using a liquid such as acetone (ACE) or isopropanol (IPA) to dewax the surface of the LED wafer 2 facing the crafting table 3, and the LED wafer 2 is detached from the crafting table 3. The present step is also referred as the dewaxing step.

Step 15: the LED wafer 2 is fixed on an elastic membrane 5 (also referred as the blue film) which is surrounded by an expansion loop 51. One surface of the LED wafer 2 having the light-emitting unit 22 faces the elastic membrane 5, and the other surface of the LED wafer 2 having the fixing piece 4 faces outwards.

Step 16: the LED wafer 2 together with the fixing piece 4 are cut and broken, such that the LED wafer 2 forms a plurality of LEDs 20. Specifically, the LED wafer 2 is cut into a plurality of blocks by way of laser scribing according to a predetermined size. Then, by applying an instant impact on the LED wafer 2 along the trace of the cutting line, the blocks will separate from each other to form a plurality of LEDs 20. The present step is also referred as the breaking step.

Step 17: a UV light is projected on the fixing piece 4 to decompose the viscose, and then the fixing piece 4 is peeled from the LEDs 20.

Figure 5:
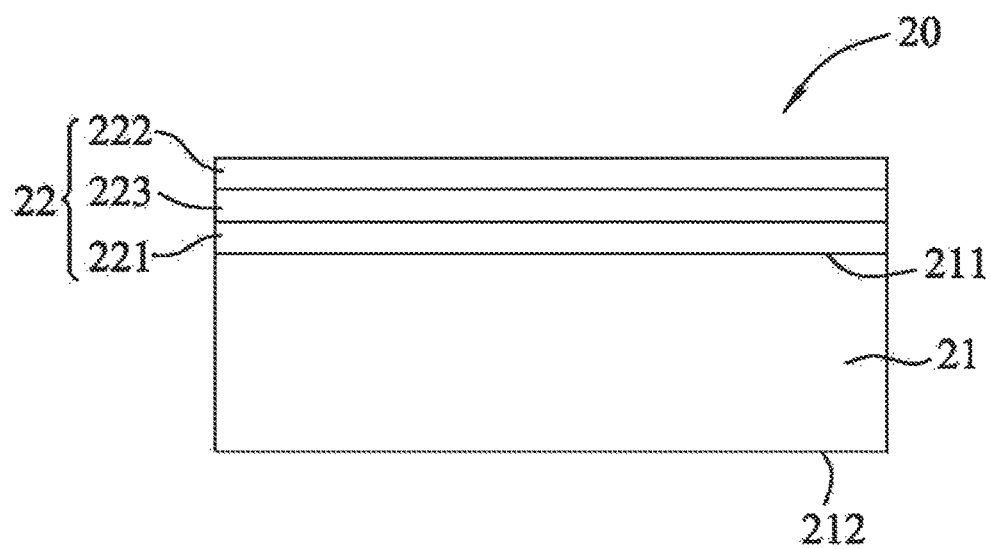
FIG. 5 is a schematic diagram of an LED according to an embodiment of the disclosure.

Step 18: the elastic membrane 5 is pulled outwards and expanded towards the radial direction (such as the arrow direction indicated in the last step of FIG. 4) by an expander not illustrated in the diagram, such that the LEDs 20 are separated from each other as the elastic membrane 5 expands. After the expansion step is completed, a certain distance exists between adjacent LEDs 20, such that the LEDs 20 can be easily removed from the elastic membrane 5 one by one. Referring to FIG. 5, each of the LEDs 20 manufactured using the manufacturing method of the disclosure and the LED wafer 2 in FIG. 1 have different sizes but both include the same layers. That is, both include a substrate 21, an n-type semiconductor layer 221, a p-type semiconductor layer 222 disposed above the n-type semiconductor layer 221, and a light-emitting layer 223 interposed between the n-type semiconductor layer 221 and the p-type semiconductor layer 222.

In the disclosure, the thickness of the substrate 21 is reduced to be smaller than or equal to 100 μm. Or, the thickness of the substrate 21 is even reduced to be smaller than or equal to 50 μm in an ultra-thinning process, such that the LED 20 can be miniaturized or thinned. Before the LED wafer 2 is removed from the crafting table 3 (that is, before the dewaxing step), the fixing piece 4 can be pasted on the LED wafer 2 to provide a supporting force to the LED wafer 2 to maintain the flatness of the wafer and avoid the wafer being warped due to residual stress. Moreover, the fixing piece 4 helps to enhance the structural strength of the LED wafer 2 and avoid the LED 20 being broken or damaged. For example, during the cutting step of the wafer, the breakage problem can be avoided, and the quality and reliability of the products can be increased. Furthermore, in the present embodiment, the UV light projected on the fixing piece 4 can decompose the viscose on the fixing piece 4, such that the fixing piece 4 can be peeled easily. The present removing step is simple and easy to implement.

Referring to FIG. 5, in terms of the structural design of the LED 20 of the disclosure, the thickness of the substrate 21 being 20-100 μm can be 2-20 times (preferably 5-10 times) larger than the thickness of the light-emitting unit 22. When the thickness ratio is 2-20 as described above, the light emitted from the LED 20 can be better centralized and generate a smaller output angle which is advantageous to the situation when the flash light of a mobile phone is used. Besides, when the ratio of the thickness of the substrate 21 to the thickness of the light-emitting unit 22 is too large, the thinning design will be disadvantaged. Therefore, the ratio range disclosed above is a preferred range.

Figure 6:
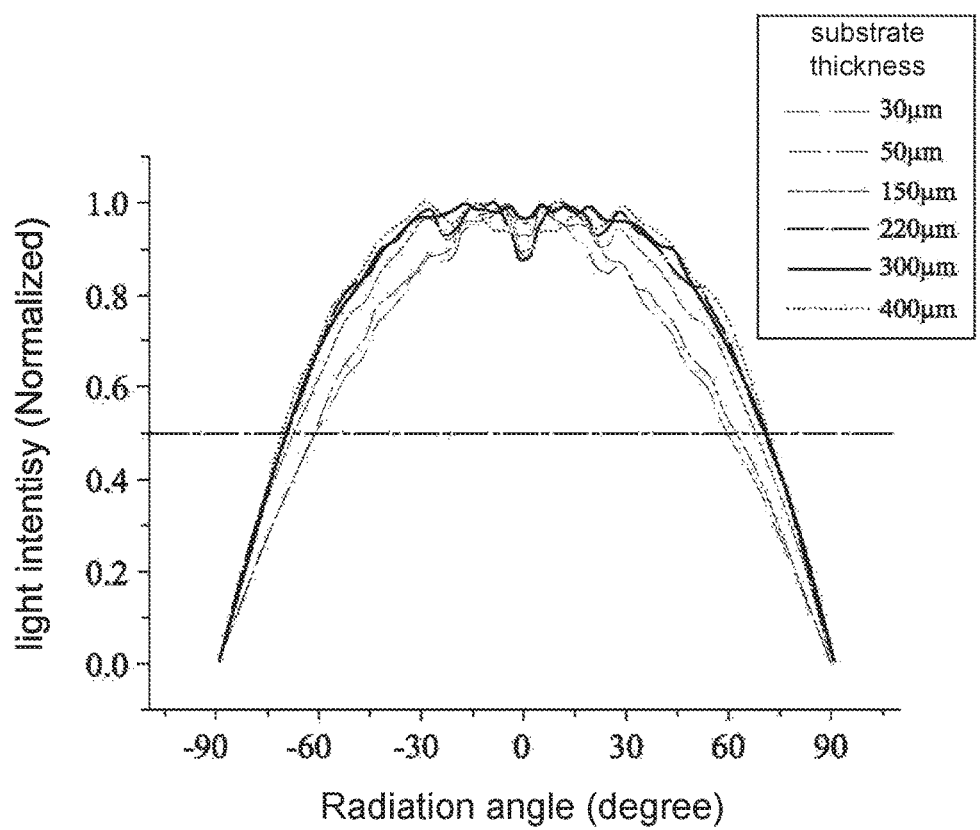
FIG. 6 is a relationship chart of light intensity versus radiation angle.

The range of the beam-divergence angle of the LED 20 preferably is between 115°-140°, and more preferably is between 115°-130°. Within the range of the beam-divergence angle, the light can be better centralized, and such design is advantageous to the situation requiring the light to be centralized. Moreover, the range of the beam-divergence angle disclosed above goes with a suitable thickness of the substrate 21. Referring to FIG. 6, the beam-divergence angle can be obtained through following ways. A relationship chart of light intensity versus radiation angle can be obtained from the light intensity distribution of the LED 20. The angle corresponding to a half of the maximum light intensity is the beam-divergence angle of the LED 20. As indicated in FIG. 6, when the thickness of the substrate of the LED varies, the corresponding beam-divergence angle also varies accordingly. Table 1 illustrates a number of corresponding relationships between substrate thickness and beam-divergence angle.

TABLE 1

| | Substrate thickness | | | | | |
|---|---|---|---|---|---|---|
| | 30 μm | 50 μm | 150 μm | 220 μm | 300 μm | 400 μm |
| Beam-divergence angle | 126° | 131° | 142° | 146° | 147° | 148° |

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for manufacturing a light-emitting diode (LED), comprising:
providing a LED wafer comprising a substrate and a plurality of light-emitting units formed thereon;
removing at least a portion of the substrate;
fixing the LED wafer on an extensible membrane, wherein the light-emitting unit faces the extensible membrane;
breaking the LED wafer to form a plurality of LED dices separated from each other, wherein each LED dice comprises at least one light-emitting unit; and
expanding the extensible membrane to make a distance between any two of the LED dices become larger,
wherein a fixing piece is pasted on a surface of the substrate before the step of fixing the LED wafer on the extensible membrane, and the LED wafer is broken together with the fixing piece to form the LED dices.

2. The method according to claim 1, further comprising removing the fixing piece after breaking the LED wafer.

3. The method according to claim 1, wherein the step of removing the portion of the substrate comprises a grinding step and a polishing step.

4. The method according to claim 1, further comprising a waxing step for adhering the LED wafer to a crafting table.

5. The method according to claim 4, further comprising a dewaxing step for detaching the LED wafer from the crafting table.

6. The method according to claim 1, wherein the step of removing the fixing piece is implemented by irradiating a UV light on the fixing piece to decompose a viscose on the fixing piece and then removing the fixing piece from the LED dices.

7. The method according to claim 1, wherein after the step of removing the portion of the substrate, the substrate has a thickness 2-20 times larger than a thickness of the light-emitting unit.

8. The method according to claim 1, wherein after the step of removing the portion of the substrate, the substrate is thinned down to have a thickness smaller than or equal to 100 μm.

9. The method according to claim 1, wherein before the step of breaking the LED wafer, the LED wafer is cut into a plurality of blocks by way of laser scribing.

10. The method according to claim 1, wherein a range of the beam-divergence angle of the LED dices is centralized between 115°-140° after the step of removing the portion of the substrate.

11. The method according to claim 10, wherein a range of the beam-divergence angle of the LED dices is centralized between 115°-130° after the step of removing the portion of the substrate.

12. A manufacturing method of light-emitting diode (LED), comprising:
providing an LED wafer comprising a substrate and a light-emitting unit formed on the substrate;
removing at least a portion of the substrate;
pasting a fixing piece on a surface of the LED wafer;
fixing the LED wafer to an extensible membrane, wherein the light-emitting unit faces the extensible membrane, and the LED wafer is disposed between the fixing piece and the extensible membrane, and the fixing piece, the LED wafer and the extensible membrane form a complex;
breaking the LED wafer in the complex to form a plurality of LED dices;
removing the fixing piece from the complex to remain the LED dices disposed on the extensible membrane; and
expanding the extensible membrane to make a distance between any two of the LED dices become larger.

13. The method according to claim 12, wherein the step of removing the portion of the substrate comprises a grinding step and a polishing step.

14. The method according to claim 12, further comprising a waxing step for adhering the LED wafer to a crafting table and a dewaxing step for detaching the LED wafer from the crafting table.

15. The method according to claim 12, wherein the step of removing the fixing piece is implemented by irradiating a UV light on the fixing piece to decompose a viscose on the fixing piece and then removing the fixing piece from the LED dices.

16. The method according to claim 12, wherein after the step of removing the portion of the substrate, the substrate has a thickness 2-20 times larger than a thickness of the light-emitting unit.

17. The method according to claim 12, wherein after the step of removing the portion of the substrate, the substrate is thinned down to have a thickness smaller than or equal to 100 μm.

18. The method according to claim 12, wherein before the step of breaking the LED wafer, the LED wafer is cut into a plurality of blocks by way of laser scribing.

19. The method according to claim 12, wherein a range of the beam-divergence angle of the LED dices is centralized between 115°-140° after the step of removing the portion of the substrate.

20. The method according to claim 19, wherein a range of the beam-divergence angle of the LED dices is centralized between 115°-130° after the step of removing the portion of the substrate.

* * * * *